US007696937B2

(12) United States Patent
Raimann

(10) Patent No.: US 7,696,937 B2
(45) Date of Patent: Apr. 13, 2010

(54) ANTENNA COMBINER WITH A TRY SQUARE

(75) Inventor: Markus Raimann, Waalhaupten (DE)

(73) Assignee: Rohde & Schwarz GmbH & Co. KG, München (DE)

( * ) Notice: Subject to any disclaimer, the term of this patent is extended or adjusted under 35 U.S.C. 154(b) by 403 days.

(21) Appl. No.: 11/815,309

(22) PCT Filed: Feb. 1, 2006

(86) PCT No.: PCT/EP2006/000876

§ 371 (c)(1), (2), (4) Date: Sep. 12, 2007

(87) PCT Pub. No.: WO2006/082039

PCT Pub. Date: Aug. 10, 2006

(65) Prior Publication Data

US 2008/0129614 A1 Jun. 5, 2008

(30) Foreign Application Priority Data

Feb. 4, 2005 (DE) ....................... 10 2005 005 261

(51) Int. Cl.
*G01R 29/10* (2006.01)
*H01Q 1/50* (2006.01)

(52) U.S. Cl. ....................................... 343/703; 343/906

(58) Field of Classification Search ................. 343/703, 343/906, 702; 455/67.11, 67.7, 425, 575.7
See application file for complete search history.

(56) References Cited

U.S. PATENT DOCUMENTS

| | | | | |
|---|---|---|---|---|
| 6,223,033 | B1 | 4/2001 | Lusterman | |
| 6,384,789 | B2 * | 5/2002 | Hofmann | 343/702 |
| 6,839,032 | B2 * | 1/2005 | Teshirogi et al. | 343/702 |
| 6,850,207 | B2 * | 2/2005 | Chen | 343/878 |
| 6,915,111 | B2 * | 7/2005 | Chen et al. | 455/67.11 |
| 6,943,739 | B1 * | 9/2005 | Rousu et al. | 343/702 |
| 7,038,629 | B2 * | 5/2006 | Holzmann et al. | 343/703 |
| 2005/0264469 | A1 * | 12/2005 | Nowotarski | 343/895 |

FOREIGN PATENT DOCUMENTS

| | | | |
|---|---|---|---|
| CH | 622 453 | A5 | 4/1981 |
| DE | 197 32 639 | C1 | 1/1999 |
| DE | 200 14 882 | U1 | 2/2001 |
| DE | 100 56 638 | C1 | 6/2002 |
| DE | 101 29 408 | A1 | 1/2003 |
| DE | 103 56 087 | A1 | 6/2005 |
| EP | 0 887 233 | A2 | 12/1998 |

(Continued)

OTHER PUBLICATIONS

International Preliminary Report on Patentability for PCT/EP2006/000876 dated Jan. 10, 2008.
International Search Report for PCT/EP2006/000876 dated May 12, 2006.

*Primary Examiner*—Hoang V Nguyen
(74) *Attorney, Agent, or Firm*—Marshall, Gerstein & Borun LLP

(57) ABSTRACT

An antenna coupler for testing mobile transmitters and/or receivers, especially mobile telephones, comprises a mounting surface for the mobile transmitter and/or receiver and an antenna element. A mounting bracket is disposed on the mounting surface.

18 Claims, 3 Drawing Sheets

FOREIGN PATENT DOCUMENTS

| | | | |
|---|---|---|---|
| EP | 0 993 209 | A2 | 4/2000 |
| EP | 1 422 846 | A1 | 5/2004 |
| JP | 2000009779 | | 1/2000 |
| JP | 2000013073 | | 1/2000 |
| WO | WO-2005/055361 | | 6/2005 |

* cited by examiner

ANTENNA COMBINER WITH A TRY SQUARE

This application is a 371 of PCT/EP06/00876 dated Feb. 1, 2006.

BACKGROUND OF THE INVENTION

1. Field of the Invention

The invention relates to an antenna coupler for testing transmitters and/or receivers, especially mobile telephones or devices, which operate according to the Bluetooth standard.

2. Related Technology

An antenna coupler for testing mobile telephones is known from DE 197 32 639 C1. With the known antenna coupler, a mounting element for a mobile telephone is attached to a printed circuit board. A rod antenna, which acts, in particular, as a dipole antenna, is formed on the printed circuit board using stripline technology. One substantial property of the antenna coupler is the coupling factor, which specifies the ratio of the received power relative to the total radiated power. Since the known arrangement reacts in an extremely sensitive manner to changes of position of the antenna of the mobile telephone, the coupling factor for each type of mobile telephone attached to the mounting element is different.

Moreover, an antenna coupler for testing mobile transmitters and/or receivers, especially mobile telephones, is known from DE 101 29 408 A1. This antenna coupler provides a mounting element and/or a mounting surface for the mobile transmitter and/or receiver and at least one antenna element. In this context, the antenna element is formed as a loop, which is at least substantially closed in spatial terms.

The particular disadvantage of the antenna couplers described above is that mobile telephones of different structural shapes cannot be arranged in the respective mounting elements in such a manner that a satisfactory coupling to the antenna couplers is guaranteed. As a result, high levels of coupling attenuation occur, which obstruct or completely prevent the testing of the mobile telephones.

SUMMARY OF THE INVENTION

The invention provides an antenna coupler, which is designed to accommodate any required transmitters and/or receivers, for example, mobile telephones of different structural design, in an optimum manner for testing purposes.

According to the invention, an antenna coupler for testing mobile transmitters and/or receivers comprises a mounting surface for the mobile transmitter and/or receiver and at least one antenna element and a mounting bracket disposed on the mounting surface, the mounting bracket comprising one or more pins on a side of the mounting bracket facing toward the mounting surface, wherein the mounting bracket can be rotated about a single pin into any required angular position.

The mounting bracket allows the simple mounting of mobile telephones of any required shape in reproducible positions without a reduction in coupling resulting from oblique positioning.

BRIEF DESCRIPTION OF THE DRAWINGS

The invention is described in greater detail below with reference to the drawings. The drawings are as follows.

DETAILED DESCRIPTION

Figure 1:
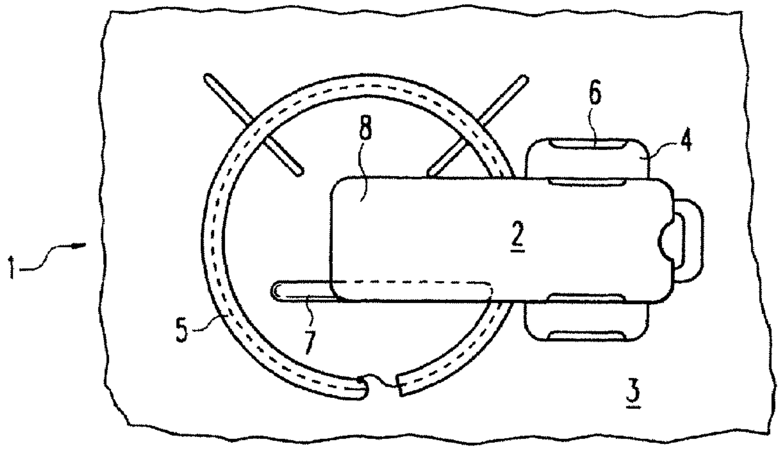
Fig. 1 Prior Art
FIG. 1 shows an exemplary embodiment of an antenna coupler according to the prior art in plan view.

By way of explanation of the measures according to the invention, FIG. 1 shows a plan view of an antenna coupler 1 in an exemplary embodiment according to the prior art. The antenna coupler 1 is used for testing a mobile telephone 2. For this purpose, the mobile telephone 2 is positioned over an antenna element 5 by means of a mounting element 4 of the antenna coupler 1 attached to a mounting surface 3. The antenna element 5 in this context is preferably designed in spatial terms as a substantially-closed loop. However, it can also be designed, for example, as a stripline rod antenna or slot antenna. The mounting element 4 is intended to specify a defined position and to prevent any displacement of the mobile telephone 2 during the measurements to be implemented. In particular, for this purpose, the mounting element 4 provides several locking elements 6 for the attachment of the mobile telephone 2.

An antenna 7 of the mobile telephone 2, which is represented in the interior of the mobile telephone 2 by a broken line, is arranged over the antenna element 5 by this mounting. Since the exact position of the antenna 7 cannot readily be judged from the outside, an accurately-centered arrangement of the antenna 7 over the antenna element 5 can be achieved only with difficulty, that is to say, only by means of a troublesome calibration. The situation is made more difficult, if mobile telephones 2 are to be tested, in which the antenna 7 is accommodated entirely inside the housing 8 of the mobile telephone. This also becomes awkward, if an accurate spatial adjustment has to be implemented for different mobile telephones 2.

One further problem is that the mounting element 4 is only suitable for mobile telephones 2, which do not exceed a given width between the locking elements 6. However, since many mobile telephones 2 nowadays have very different shapes designed for folding or rotating in view of the wide range of additional functions such as integral cameras etc., such mobile telephones can be placed into the mounting element 4 only with difficulty or not at all. As a result, the coupling values deteriorate dramatically making the testing of the device impossible in some circumstances.

The invention avoids the named problems by proposing an antenna coupler 1, with which any required mobile telephones 2 can be reliably tested. The components of an exemplary embodiment of an antenna coupler 1 designed according to the invention are shown in an extremely schematic form in FIGS. 2A and 2B.

Figure 2A:
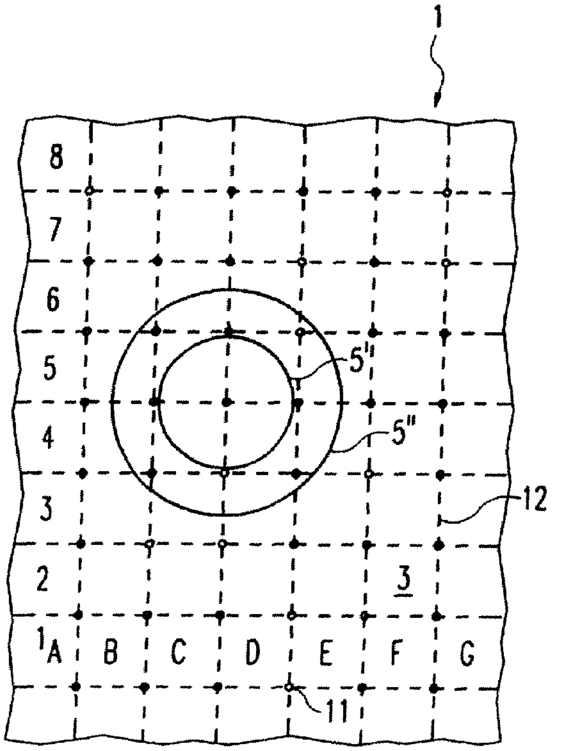
FIGS. 2A-2C show schematic views of the components of an exemplary embodiment of an antenna coupler designed according to the invention.
Figure 2B:
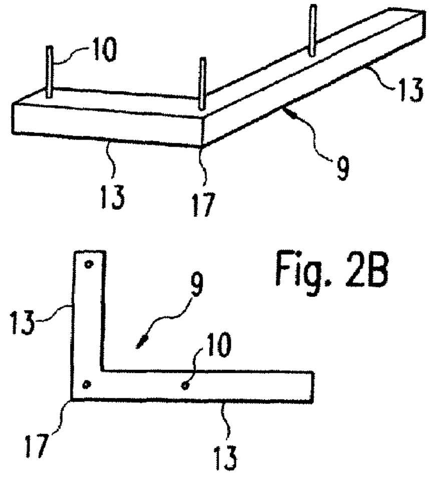

According to the invention, a mounting bracket 9 is provided, as shown in FIG. 2B in perspective and from below, which can be arranged on the mounting surface 3 of the antenna coupler 1 by means of the pins 10, as illustrated in FIG. 2A. In this context, the mounting bracket 9 provides two substantially mutually-perpendicular arms 13, which can be of different lengths and which provide a mounting for the mobile telephone 2 to be tested. The pins 10 are disposed on a side of the mounting bracket 9 facing towards the mounting surface 3 and can be inserted into the openings 11 in the mounting surface 3 of the antenna coupler 1. These openings 11 are arranged in the form of a rectangular raster 12 on the mounting surface 3. The spacing distances between the openings 11 are substantially equal in both spatial directions. Reference numbers 5' and 5" indicate markings on the upper side of the mounting surface 3, which correspond with the position of the loop-shaped antenna elements 5 beneath the mounting surface 3.

Since it is possible to adjust the mounting bracket 9 on the raster 12, mobile telephones 2 of any required shape can be placed onto the antenna coupler 1, and reproducible positions for individual models can be established by an appropriate selection of the markings. For this purpose, for example, a horizontal axis (x-axis) can be marked with letters and a vertical axis (y-axis) can be marked with numbers, to allow a simple location of predetermined positions. In this context, the pin 10, which is fixed at the corner 17 of the mounting bracket 9, is preferably used as a reference point. The reference markings are illustrated by way of example in FIG. 2A but have been omitted in the other drawings for reasons of clarity.

Figure 3:
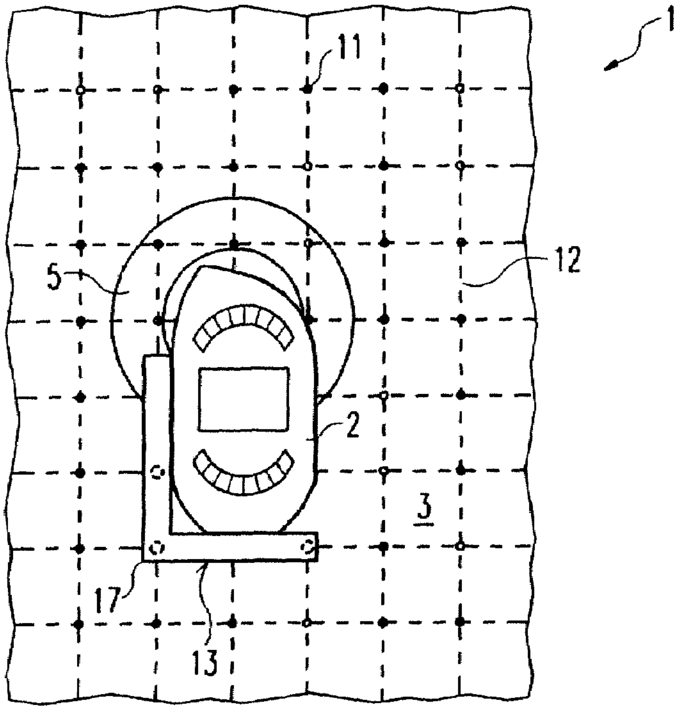
FIG. 3 shows a view of a first mobile telephone on the antenna coupler designed according to the invention.
Figure 4:
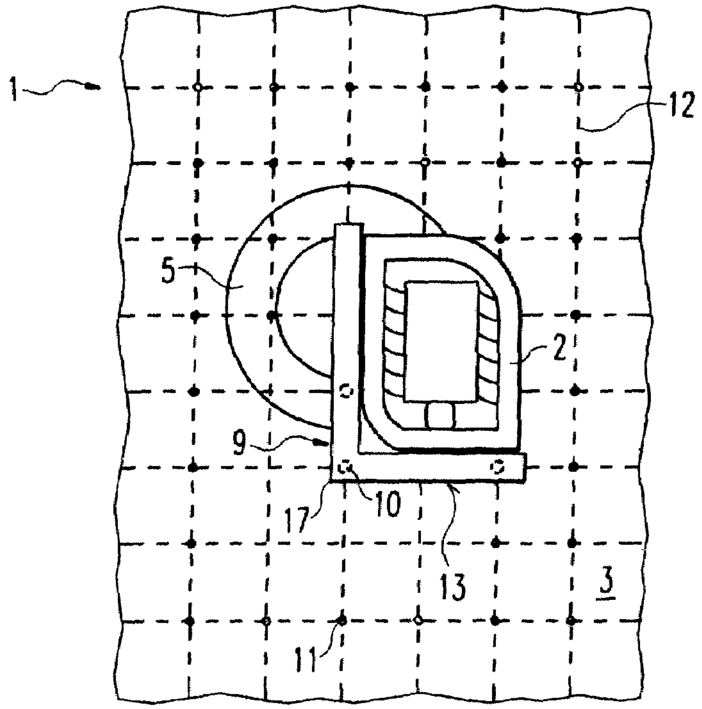
FIG. 4 shows a view of a second mobile telephone on the antenna coupler designed according to the invention.
Figure 5:
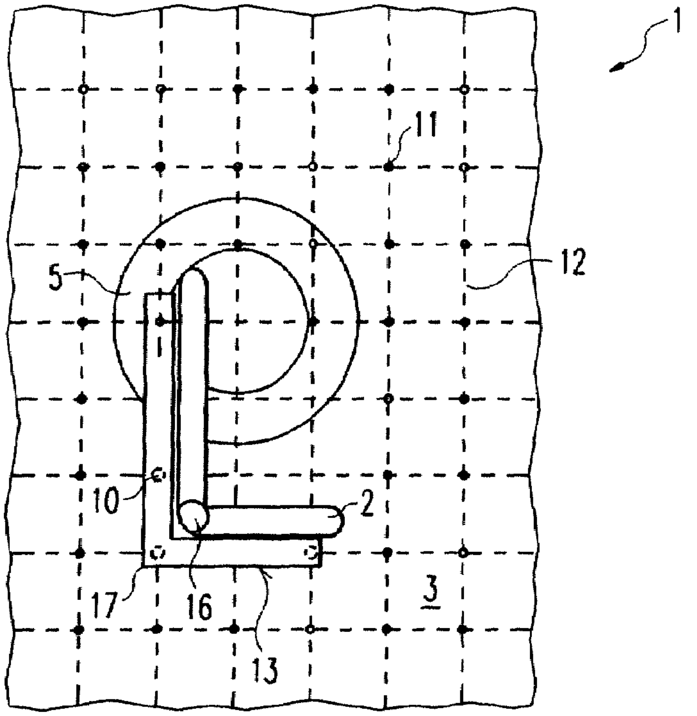
FIG. 5 shows a view of a third mobile telephone on the antenna coupler designed according to the invention.

Examples of the positioning of mobile telephones of different shapes in the mounting bracket 9 on the mounting surface 3 are illustrated schematically by way of example in the subsequent FIGS. 3 to 5. The position of the pins 10 of the mounting bracket 9 is illustrated in each case with a broken line in order to indicate the plug-in positions.

The mobile telephones shown in FIGS. 3 and 4 each provide a broad shape, which differs from conventional mobile telephones 2; they have no visible antenna 7 and can therefore be tested with conventional antenna couplers 1 only with difficulty or not at all. However, they can be placed simply and securely in an antenna coupler 1 designed according to the invention. If the position is not ideal, as, for example, in FIG. 4, the location of the mounting bracket 9 can simply be altered by re-positioning the pins, in order to achieve a better coupling. In this context, the mounting bracket 9 with the pins 10 plugged into the openings 11 is withdrawn and plugged in again, for example, in a position further to the left. With an appropriate spacing distance between the openings 11 relative to one another and an appropriate matching of the spacing distance between the pins 10 on the mounting bracket 9, it can be ensured that a position with adequate coupling for every type of mobile telephone 2 can always be found.

FIG. 5 shows a folding mobile telephone 2, which can also be tested in a simple manner using the antenna coupler 1 and the mounting bracket 9 designed according to the invention. However, to increase the stability of the laterally-disposed mobile telephone 2 and also to prevent the mobile telephone 2 from folding into the closed position via an often spring-loaded hinge 16, the mobile telephone 2 can also be placed onto the mounting surface 3 in the folded-open condition and prevented from folding into the closed position by appropriate means.

Figure 2C:
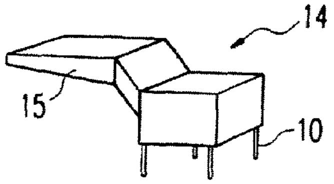

For this purpose, one or more holding elements 14 can be provided. An appropriate holding element 14 is illustrated by way of example in FIG. 2C. The holding element 14 also provides pins 10, so that it can be plugged into the mounting surface 3, and an angled arm 15, which presses the mobile telephone 2 against the mounting surface 3.

Figure 6:
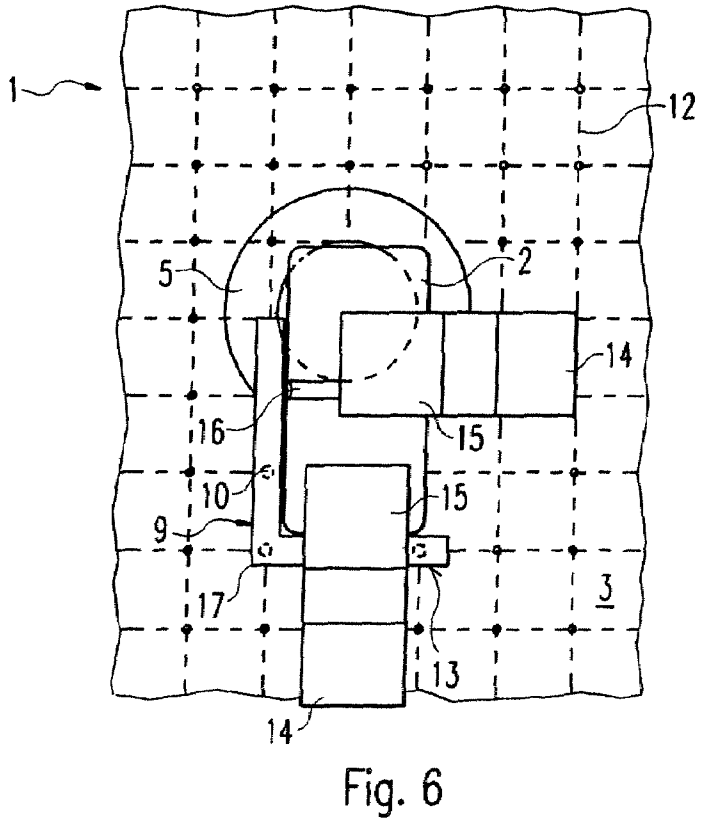
FIG. 6 shows a view of a third mobile telephone on the antenna coupler designed according to the invention in a second position.

Accordingly, as shown in FIG. 6, the mobile telephone 2 can be placed into the mounting bracket 9 in the folded-open condition and fixed with one or two holding elements 14 in such a manner that it cannot be folded into the closed position during the measuring process. With the pins 10, the holding elements 14 can also be moved into any required position, so that the mobile telephone 2 can be pressed against the mounting surface 3 in the optimum manner.

A further design aspect of the antenna coupler 1 according to the invention is a rotatable design of the mounting bracket 9. For this purpose, the mounting bracket 9 provides only the pin 10 used as a reference point, which is disposed at the corner 17 of the mounting bracket 9, so that the pin 10 can be plugged into one of the openings 11, and the mounting bracket 9 can then be rotated about this pin 10 into a preferred position. This also achieves further optimized positioning with improved coupling for differently-shaped types of mobile telephone 2. A scale can be provided on the mounting surface 3 for reading off the angular position of mounting bracket 9.

The invention is not restricted to the exemplary embodiment described. In particular, the antenna coupler is suitable for testing any required transmitters and/or receivers or respectively transmitter and/or receiver devices, wherein one preferred use is in the testing of mobile telephones 2. All the features of the invention described or characterised above can be combined with one another as required.

The invention claimed is:

1. Antenna coupler for testing mobile transmitters and/or receivers, comprising a mounting surface for the mobile transmitter and/or receiver and at least one antenna element and a mounting bracket is disposed on the mounting surface;

the mounting bracket comprising one or more pins on a side of the mounting bracket facing towards the mounting surface, wherein the mounting bracket can be rotated about a single pin into any required angular position.

2. Antenna coupler according to claim 1, wherein the mounting bracket comprises two arms arranged at right angles to one another.

3. Antenna coupler according to claim 2, wherein the two arms are at the same length.

4. Antenna coupler according to claim 2, wherein the two arms are at different lengths.

5. Antenna coupler according to claim 1, further comprising a raster disposed on the mounting surface, wherein the mounting bracket is arranged in such a manner that the mounting bracket has a position along the raster that can be displaced in two spatial directions.

6. Antenna coupler according to claim 1, wherein the pins can be plugged into openings in the mounting surface.

7. Antenna coupler according to claim 6, wherein the openings are disposed at crossing points of a raster formed on the mounting surface.

8. Antenna coupler according to claim 7, wherein the raster is formed in a rectangular manner.

9. Antenna coupler according to claim 7, wherein spacing distances between the openings in the raster are constant.

10. Antenna coupler according to claim 9, wherein the spacing distances of the openings in the raster are approximately equal in both spatial directions.

11. Antenna coupler according to claim 1, comprising at least one holding element.

12. Antenna coupler according to claim 11, wherein the at least one holding element provides the pins.

13. Antenna coupler according to claim 12, wherein the at least one holding element can be plugged into openings of the mounting surface with the pins.

14. Antenna coupler according to claim 11, wherein the at least one holding element provides an arm.

15. Antenna coupler according to claim 14, wherein the at least one holding element is suitable for pressing the mobile transmitter and/or receiver, onto the mounting surface by means of the arm.

16. Antenna coupler according to claim 1, wherein only a single pin is formed on the mounting bracket.

17. Antenna coupler according to claim 16, wherein the single pin is formed at a corner of the mounting bracket.

18. Antenna coupler according to claim 1, wherein at least two pins are formed on the mounting bracket, thereby fixing the mounting bracket in a rotationally-rigid manner on the mounting surface.

* * * * *